(12) United States Patent
Veselka, Jr. et al.

(10) Patent No.: US 9,787,208 B2
(45) Date of Patent: Oct. 10, 2017

(54) SINGLE PHASE AC CHOPPER FOR HIGH CURRENT CONTROL OF COMPLEX AND SIMPLE LOADS

(71) Applicant: AVO Multi-Amp Corporation, Dallas, TX (US)

(72) Inventors: Harvey Wayne Veselka, Jr., Mesquite, TX (US); Eugenio Jorge Tacconi, Arlington, TX (US)

(73) Assignee: AVO Multi-Amp Corporation, Dallas, TX (US)

( * ) Notice: Subject to any disclaimer, the term of this patent is extended or adjusted under 35 U.S.C. 154(b) by 33 days.

(21) Appl. No.: 14/434,639

(22) PCT Filed: Oct. 15, 2013

(86) PCT No.: PCT/US2013/065044
§ 371 (c)(1),
(2) Date: Apr. 9, 2015

(87) PCT Pub. No.: WO2014/062675
PCT Pub. Date: Apr. 24, 2014

(65) Prior Publication Data
US 2015/0280596 A1   Oct. 1, 2015

Related U.S. Application Data

(60) Provisional application No. 61/713,977, filed on Oct. 15, 2012.

(51) Int. Cl.
*H02M 5/293* (2006.01)
*G01R 31/40* (2014.01)
*G01R 31/327* (2006.01)

(52) U.S. Cl.
CPC ........ *H02M 5/293* (2013.01); *G01R 31/3272* (2013.01); *G01R 31/40* (2013.01); *H02M 2005/2932* (2013.01)

(58) Field of Classification Search
CPC ............................. H02M 5/293; G01R 31/40
See application file for complete search history.

(56) References Cited

U.S. PATENT DOCUMENTS

| 4,307,345 | A | 12/1981 | Schoen |
| 7,599,196 | B2 | 10/2009 | Alexander |

(Continued)

FOREIGN PATENT DOCUMENTS

EP    1465037 A2 * 10/2004    ............... G05F 1/12

OTHER PUBLICATIONS

PCT International Search Report; Application No. PCT/US2013/065044; dated Mar. 18, 2014; 2 pages.

(Continued)

*Primary Examiner* — Jermele M Hollington
*Assistant Examiner* — Zannatul Ferdous
(74) *Attorney, Agent, or Firm* — Conley Rose, P.C.; J. Robert Brown, Jr.

(57) ABSTRACT

A testing device is provided. The testing device comprises a processor and a switching AC to AC power converter that has no DC link. The processor is configured to set a plurality of bi-directional switches in the power converter in a configuration of on/off states that cause a substantially set electric current to flow through a component being tested by the testing device.

17 Claims, 10 Drawing Sheets

II. Normal Conductance Positive: Active Positive
Voltage is Positive and Current is Positive (56) References Cited

U.S. PATENT DOCUMENTS

| | | |
|---|---|---|
| 2006/0103365 A1 | 5/2006 | Ben-Yaacov |
| 2008/0074095 A1* | 3/2008 | Telefus .................. H02M 1/10 |
| | | 323/282 |
| 2010/0149843 A1 | 6/2010 | Walde et al. |
| 2010/0181933 A1 | 7/2010 | Langovsky |
| 2011/0148431 A1 | 6/2011 | Satou et al. |
| 2012/0112547 A1 | 5/2012 | Ghosh et al. |
| 2012/0265360 A1 | 10/2012 | Smit |

OTHER PUBLICATIONS

PCT Written Opinion of the International Searching Authority; Application No. PCT/US2013/065044; dated Mar. 18, 2014; 6 pages.

European Extended Search Report; Application No. 13846396.3; dated Feb. 23, 2017; 9 pages.

Khanniche, M.S., et al.; "Real Time Hysteresis Controller for Relay Testing"; IEEE Proceedings: Electrical Power Applications; vol. 141, No. 2; Mar. 1994; 6 pages.

Ben-Yaakov, Sam, et al.; "A Four Quadrants HF AC Chopper with No Deadtime"; IEEE; 2006; 5 pages.

* cited by examiner

Figure 1

I. Cross Conductance: Voltage is Positive and Current is Negative
II. Normal Conductance Positive: Voltage is Positive and Current is Positive
III. Cross Conductance: Voltage is Negative and Current is Positive
IV. Normal Conductance Negative: Voltage is Negative and Current is Negative

Figure 2

II. Normal Conductance Positive: Free Wheeling Positive
Voltage is Positive and Current is Positive

Figure 3

IV. Normal Conductance Negative: Active Negative
Voltage is Negative and Current is Negative

Figure 4

IV. Normal Conductance Negative: Free Wheeling Negative
Voltage is Negative and Current is Negative

AC Chopper Switching Scheme

| | Voltage | Current | Switch 1 | Switch 2 | Switch 3 | Switch 4 |
|---|---|---|---|---|---|---|
| 905 — Active Positive | + | + | ON | OFF | OFF | ON |
| 915 — Freewheeling Positive | + | + | OFF | OFF | OFF | ON |
| 925 — Active Negative | − | − | OFF | ON | ON | OFF |
| 935 — Freewheeling Negative | − | − | OFF | ON | ON | OFF |
| 945 — Cross Conductance Active | + | − | ON | OFF | OFF | OFF |
| 955 — Dead Time | + | − | OFF | OFF | OFF | OFF |
| 965 — Cross Conductance Freewheeling | + | − | OFF | OFF | ON | OFF |
| 975 — Cross Conductance Active | − | + | ON | ON | OFF | OFF |
| 985 — Dead Time | − | + | OFF | OFF | OFF | OFF |
| 995 — Cross Conductance Freewheeling | − | + | OFF | OFF | ON | ON |

SINGLE PHASE AC CHOPPER FOR HIGH CURRENT CONTROL OF COMPLEX AND SIMPLE LOADS

CROSS REFERENCE

This application is a filing under 35 U.S.C. 371 of International Application No. PCT/US2013/065044 filed Oct. 15, 2013, entitled "Single Phase AC Chopper for High Current Control of Complex and Simple Loads" claiming priority to U.S. Provisional Application No. 61/713,977 filed on Oct. 15, 2012, entitled "Single Phase AC Chopper for High Current Control of Complex and Simple Loads," which are incorporated by reference herein as if reproduced in their entirety.

BACKGROUND

The electric power system in the United States generates three-phase alternating current (AC) electric power. Each power phase is 120 degrees out of phase, plus or minus, with the other two power phases. The voltage of any phase oscillates sinusoidally between positive voltage and negative voltage. Three-phase electric power generation, transmission, and distribution provides an acceptable compromise between the efficiency, expense, and complexity of power system equipment.

It is more efficient to transmit electric power at high voltage levels than at low voltage levels. Electric power may be generated as three-phase AC power at moderate voltage levels in the 12 kilovolt (kV) to 25 kV range. The voltage level may be stepped up to the 110 kV to 1000 kV range using a transformer for transmission over long transmission lines, hence minimizing transmission line power loss. The transmission line voltage may be stepped down, using a transformer at a substation, to the 12 kV to 35 kV range for local distribution. The local distribution voltage level may be further stepped down through one or more transformer stages to provide 120 volt AC power to residential and commercial structures. Special accommodations may be made for electric power consumers at manufacturing plants. In some contexts, the electric power system may be abstractly categorized into electric power generation, electric power transmission over extended distances, and electric power distribution to electric power consumers.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments are illustrated below, the disclosed systems and methods may be implemented using any number of techniques, whether currently known or in existence. The disclosure should in no way be limited to the illustrative implementations, drawings, and techniques illustrated below, but may be modified within the scope of the appended claims along with their full scope of equivalents.

An electric power transmission and distribution system may include current monitoring devices known as reclosers. A recloser may be configured to temporarily open a circuit when a fault condition is detected. The recloser may then automatically close the circuit without manual intervention. For example, a temporary short between overhead power lines, such as a short caused by a tree branch momentarily touching the overhead lines, may cause a circuit breaker to trip, thereby causing an open in the line. Because the fault is temporary in nature, the recloser may close the breaker and reestablish the line continuity without requiring manual intervention from an electrician. The following discussion will continue to focus on reclosers as an example of the type of device to which the disclosed embodiments may apply, but it should be understood that the embodiments may apply to other types of components in an electric power transmission and distribution system. In general, the embodiments may apply to impedances of a constant or variable nature.

Tests may occasionally be performed on reclosers and other types of electrical components to ensure that the components are operating properly. During the testing, a constant current may need to be maintained through the component. However, the impedance of a recloser may change over time, and it may be necessary to compensate for the changing impedance load in order to keep the current through the recloser constant during testing. Device manufacturers state that a series resistor with a large resistance value may be used during test procedures to compensate for the change of impedance of the recloser. The manufacturers indicate that the value of the resistor may be at least an order of magnitude greater than the impedance of the recloser itself in order to render the changing impedance of the recloser negligible. Resistors capable of providing an output current stable enough that the test point does not change may be rather large and cumbersome and may dissipate a large amount of heat and energy.

Several methods for eliminating the large resistors or reducing the value of the resistors have been considered. For example, large controllable impedances, variable capacitors and inductors, stepper motors that control variacs, and different amplifier designs, such as a magnetic amplifier, have been considered. All of these design options aim to either replace the series resistance or control the AC voltage to the transformer, thereby controlling the output current. These ideas may be impractical for this scenario because of speed, cost, weight, or size.

In an embodiment, an AC voltage controller known as an AC chopper is used to compensate for a fast changing impedance load in an oil-filled recloser or other recloser or other electrical component. Line-frequency AC choppers are typically used in heating, lighting control, soft starts, speed controllers, and similar applications but have not been used to maintain a constant current. In particular, AC choppers have not been used to maintain a constant current in a recloser during a test procedure for the recloser by compensating for a varying impedance of the recloser. The term "AC chopper" may be used hereinafter to refer to any switching AC to AC power converter and in particular to any switching AC to AC power converter that has no direct current (DC) link.

The use of an AC chopper to maintain a constant current allows the use of the mains directly without a power factor corrector (PFC) and/or a DC link. The output of the AC chopper may be varied rapidly through manipulation of the pulse width modulation (PWM) duty cycle based on set points and feedback. The use of an AC chopper allows the transformer voltage to be adjusted quickly enough to compensate for the fast changing impedances that may be present in a recloser under test. In addition, an AC chopper is affordable and compact. In an embodiment, the AC chopper uses current mode feedback, as opposed to the voltage mode that has previously been used. For such an application to function efficiently, the measurement of the output and the manipulation of the PWM may need to occur faster than the changing of the impedance.

In an embodiment, such a use of an AC chopper is not confined to variable impedance loads. The chopper/transformer combination may also have an application in constant impedance load testing, such as the testing of high current breakers. Such an application may allow for direct stepping to a desired test current rather than "walking up" or "pulsing up" to the desired test current. This in turn may allow for reduced testing time and automatic control of the testing, such as digital control or computer control.

Different topologies have typically been used for line-frequency AC choppers, depending on whether the intention is to buck, boost, or buck-boost the line voltage. In some embodiments, a single phase line-frequency buck AC chopper may be used. In other embodiments, boost or buck-boost topologies may be used, in which cases total harmonic distortion (THD) and/or electromagnetic compatibility (EMC) noise may be reduced.

When an AC chopper is implemented as disclosed herein, the switches in the AC chopper may need to be able to handle large currents and large voltages. In an embodiment, insulated gate bipolar transistors (IGBTs) are used in the switches in the AC choppers disclosed herein to provide such a capability, but the embodiments disclosed herein are not limited to the use of IGBTs.

Figure 1:
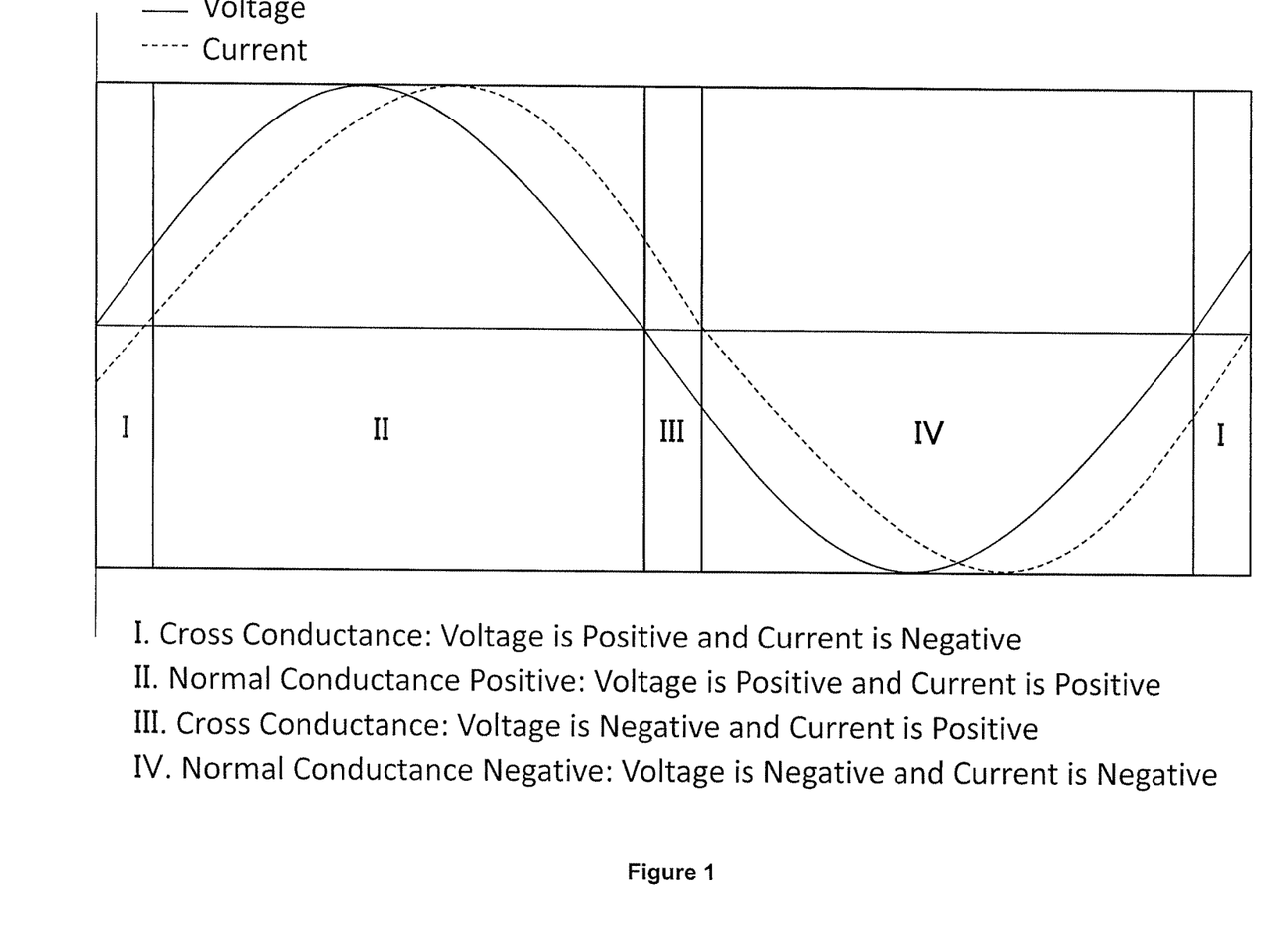
FIG. 1 is a graph of alternating voltages and currents.

In an embodiment, part count may be reduced by combining switches in a so-called "bi-directional switch", which allows current to flow in either direction through the switch. For purely resistive loads, such switches may operate in an active mode, a dead time mode, or a freewheeling mode. However, in the embodiments disclosed herein, complex impedance loads may be present. In such cases, there are times when voltage is positive but current is negative and times when voltage is negative but current is positive. Situations where the voltage and the current have opposite polarities may be referred to as cross conductance periods and are illustrated in FIG. 1. It can be seen that, in the regions labeled "I", voltage is positive and current is negative. In the region labeled "III", voltage is negative and current is positive. In the regions labeled "II" and "IV", normal conductance, rather than cross conductance, is occurring. In the region labeled "II", both voltage and current are positive, and in the region labeled "IV", both voltage and current are negative.

In the cross conductance periods in regions I and III, special switching may need to take place. Regulations concerning line conductive emissions may also need to be considered in devising a switching scheme. In an embodiment, a plurality of switches within an AC chopper are turned on or off in various configurations to create a duty cycle that provides a constant current at a desired level, even during cross conductance periods.

Figure 6:
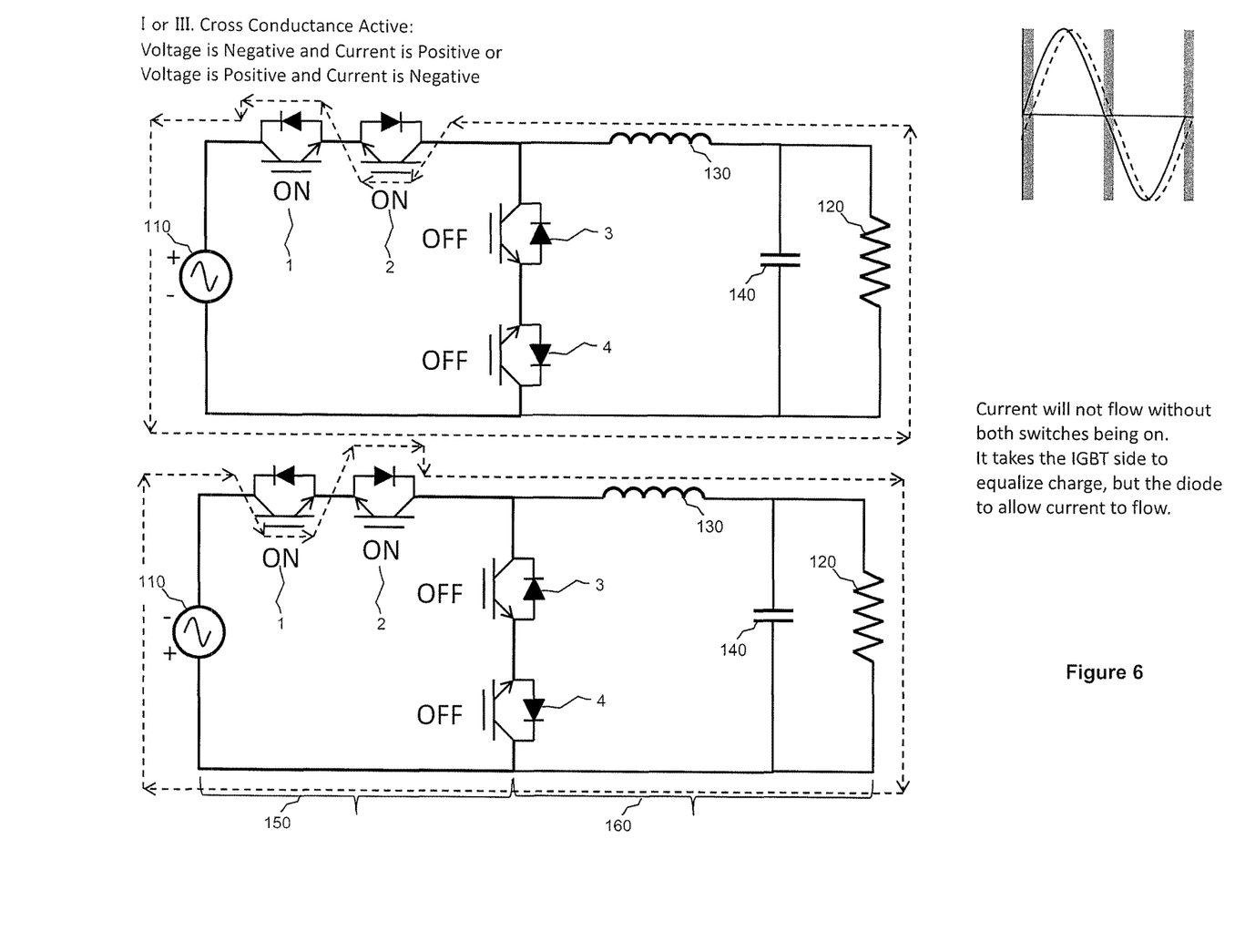
FIG. 6 is a schematic diagram of active circuits with cross conductance and with negative voltage and positive current or with positive voltage and negative current, according to an embodiment of the disclosure.
Figure 7:
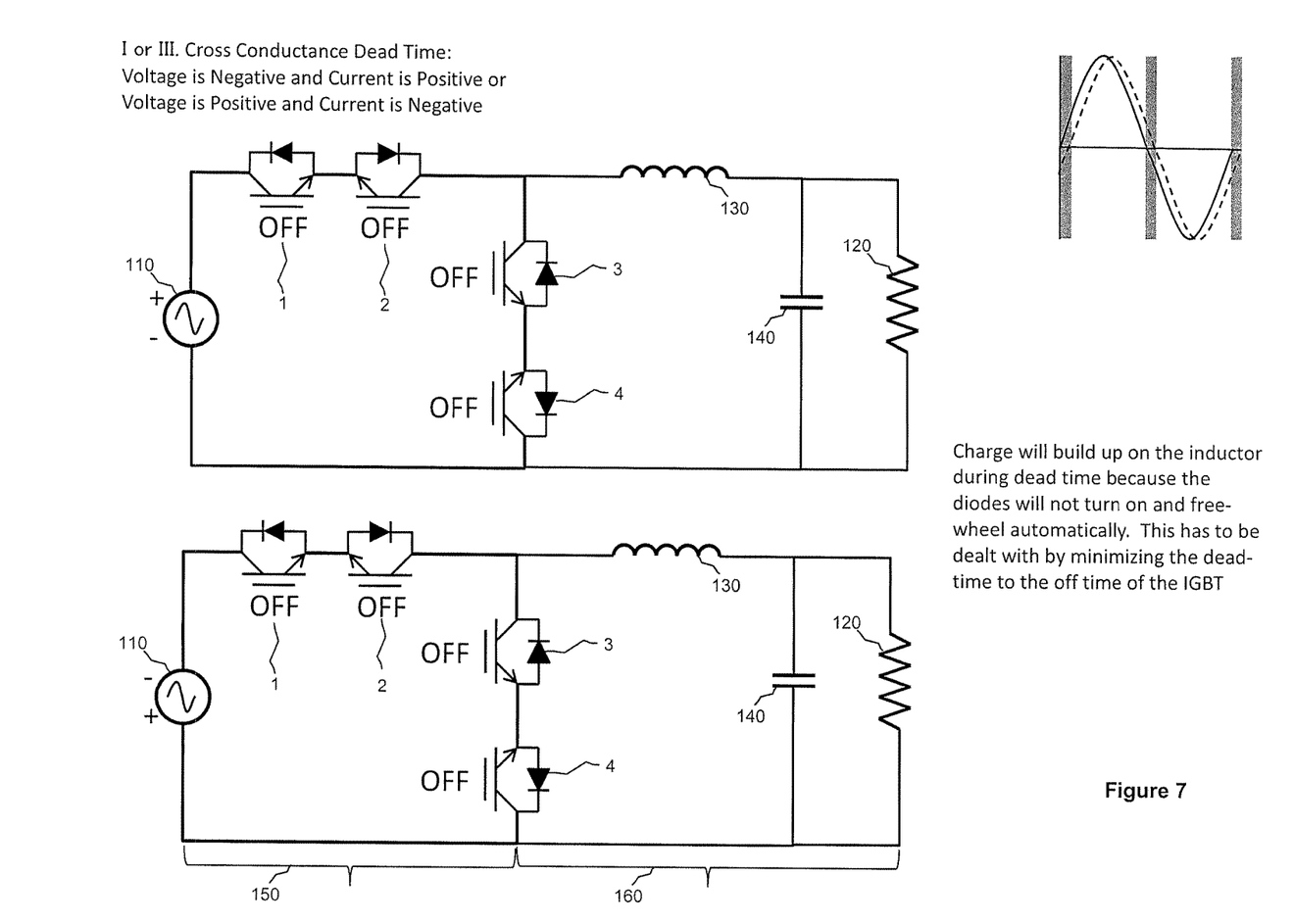
FIG. 7 is a schematic diagram of dead time circuits with cross conductance and with negative voltage and positive current or with positive voltage and negative current, according to an embodiment of the disclosure.
Figure 8:
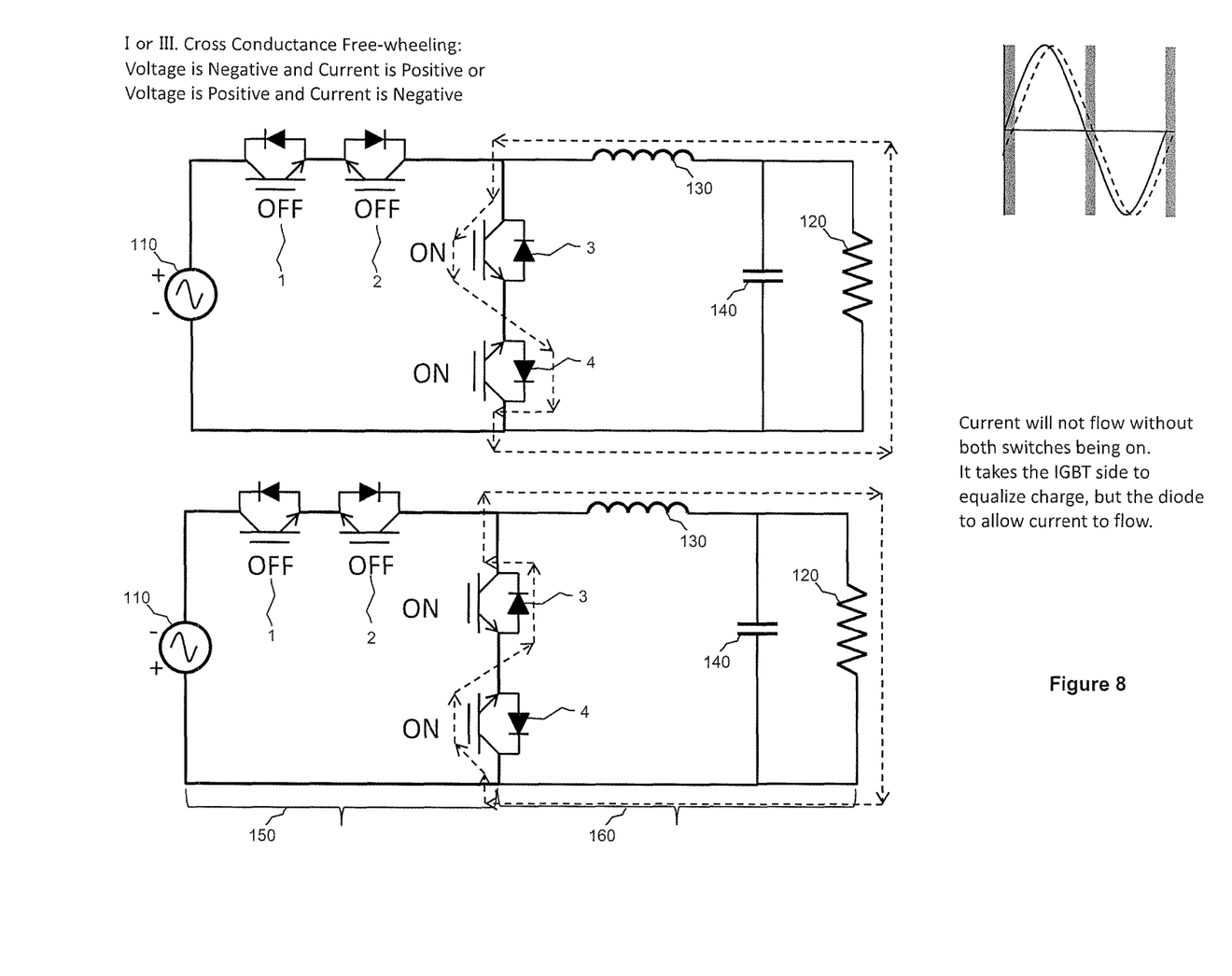
FIG. 8 is a schematic diagram of freewheeling circuits with cross conductance and with negative voltage and positive current or with positive voltage and negative current, according to an embodiment of the disclosure.

In an embodiment, seven states are used in an AC chopper circuit: active positive, active negative, freewheeling positive, freewheeling negative, cross conductance active, dead time, and cross conductance freewheeling. FIGS. 2 through 8 represent embodiments of AC chopper circuits, where the first four scenarios are depicted in FIGS. 2, 3, 4, and 5, respectively, and the latter three scenarios are depicted in FIGS. 6, 7, and 8, respectively.

In FIGS. 2 through 8, a first bi-directional switch 1 and a second bi-directional switch 2 are coupled in series with one another and in series with an AC power source 110 and a load 120. The diode portions of switches 1 and 2 are oriented in opposite directions to one another. While the load 120 is depicted purely as a resistance, the load 120 may represent a complex impedance. In particular, the load 120 may represent a recloser or other component that may have a changing impedance. It may be desired to maintain a constant current through the load 120 during testing of the load 120. An inductor 130 may also be coupled in series with the power source 110 and the load 120.

A third bi-directional switch 3 and a fourth bi-directional switch 4 are coupled in series with one another and in parallel with the power source 110 and the load 120. The diode portions of switches 3 and 4 are oriented in opposite directions to one another. A capacitor 140 may also be coupled in parallel with the power source 110 and the load 120.

Figure 2:
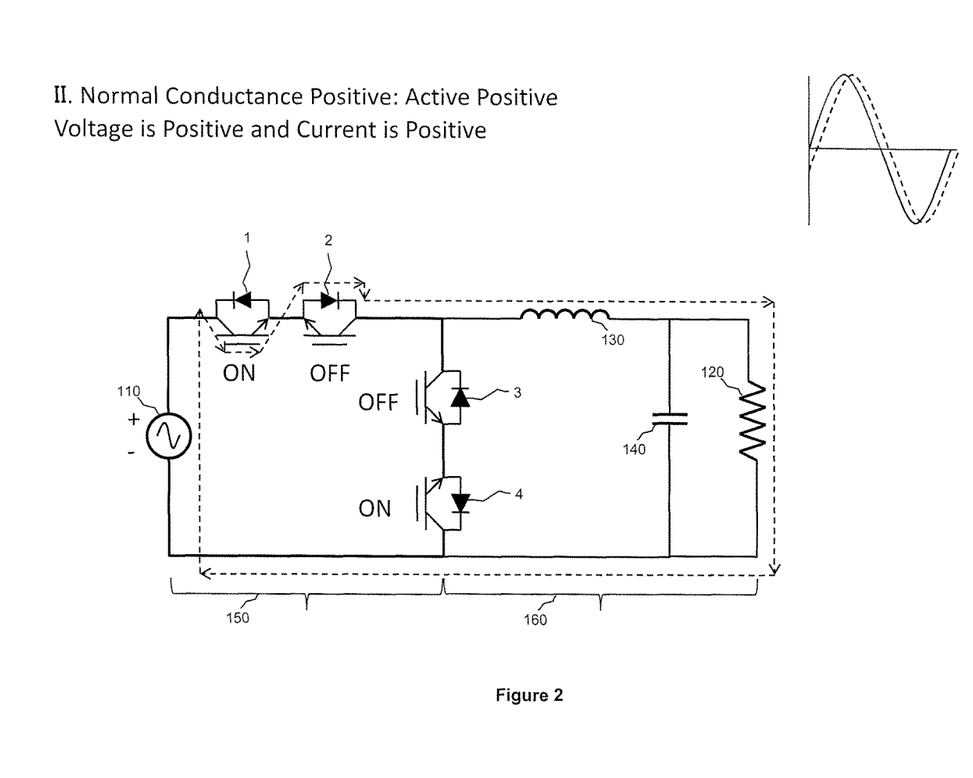
FIG. 2 is a schematic diagram of an active circuit with normal conductance and with positive voltage and positive current.

In FIG. 2, normal conductance is occurring, wherein both voltage and current are positive. The conductance may be considered active, in that current is provided by the power source 110 and is flowing through both the line portion 150 and the load portion 160 of the circuit. To achieve such a state, switch 1 is maintained in an 'on' state, switch 2 is maintained in an 'off' state, switch 3 is maintained in an 'off' state, and switch 4 is maintained in an 'on' state. Even though switch 2 is in an 'off' state, current flows in a clockwise direction in the circuit through the diode portion of switch 2.

Figure 3:
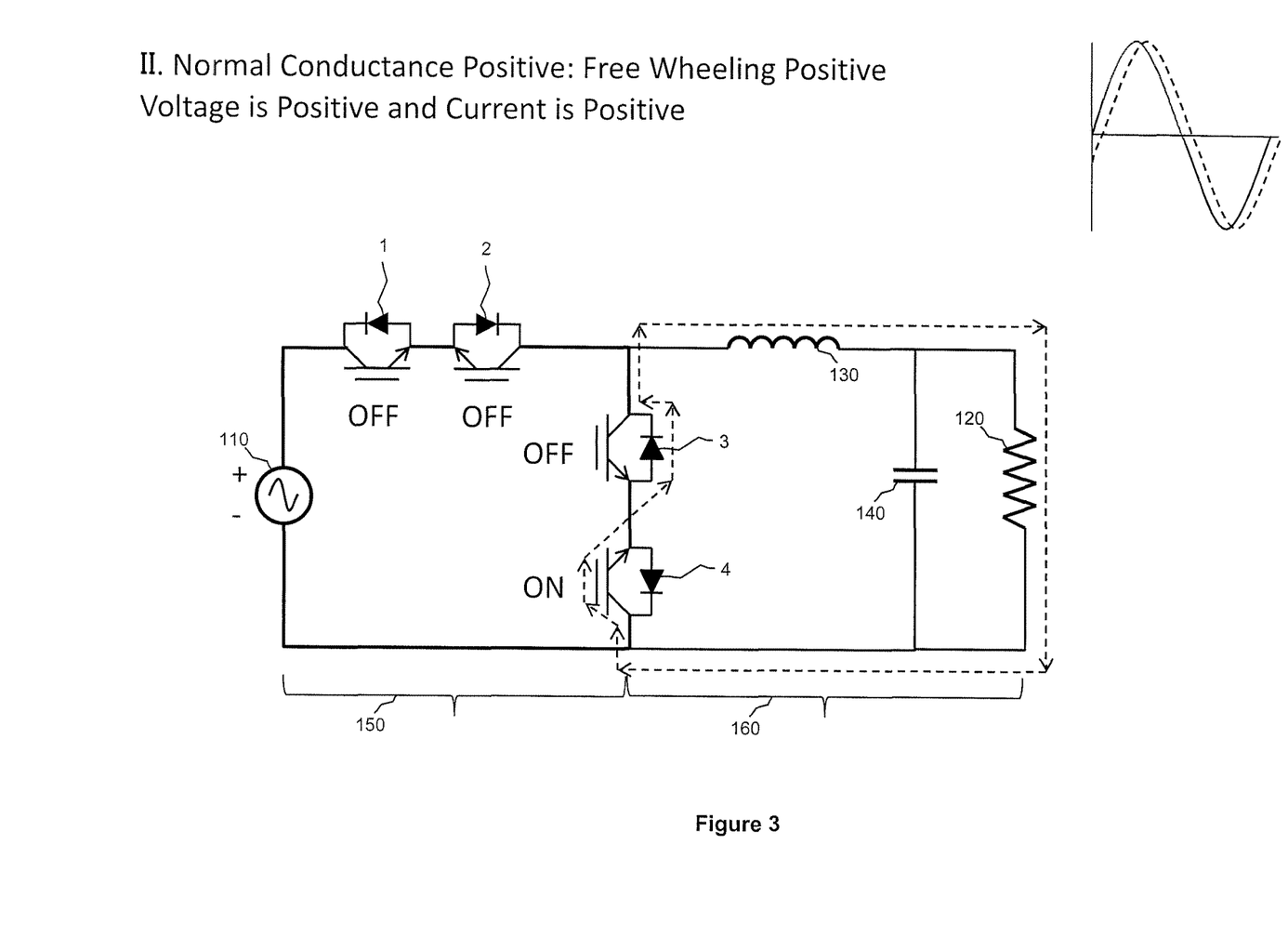
FIG. 3 is a schematic diagram of a freewheeling circuit with normal conductance and with positive voltage and positive current.

In FIG. 3, normal conductance is occurring, wherein both voltage and current are positive. The conductance may be considered freewheeling, in that current is flowing from the inductor 130 through only the load portion 160 of the circuit. To achieve such a state, switch 1 and switch 2 are both maintained in an 'off' state, thus preventing current flow through the line portion 150 of the circuit. Switch 3 is maintained in an 'off' state, and switch 4 is maintained in an 'on' state. Even though switch 3 is in an 'off' state, current flows in a clockwise direction in the load portion 160 of the circuit through the diode portion of switch 3.

Figure 4:
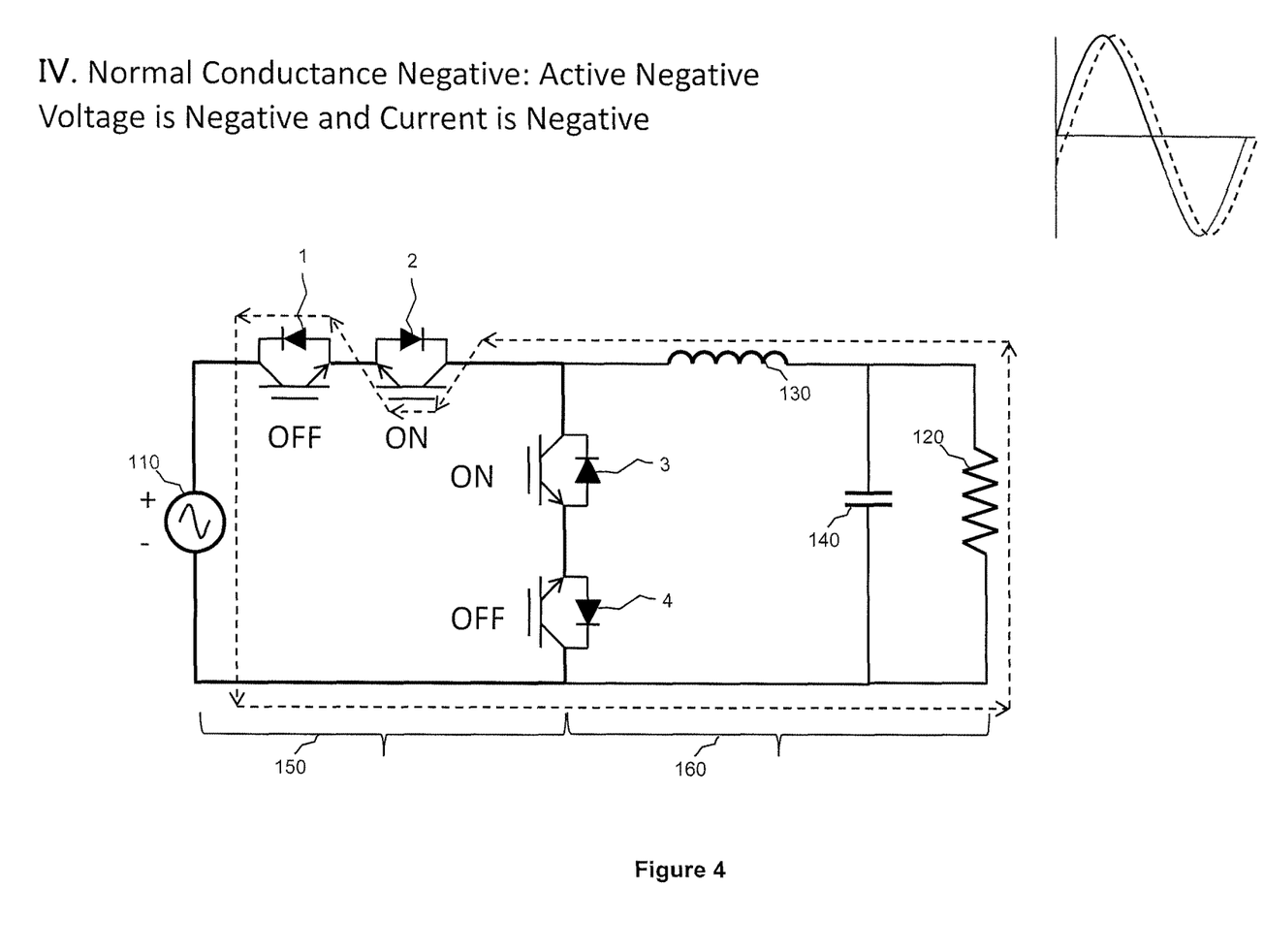
FIG. 4 is a schematic diagram of an active circuit with normal conductance and with negative voltage and negative current.

In FIG. 4, normal conductance is occurring, wherein both voltage and current are negative. The conductance may be considered active, in that current is provided by the power source 110 and is flowing through both the line portion 150 and the load portion 160 of the circuit. To achieve such a state, switch 1 is maintained in an 'off' state, switch 2 is maintained in an 'on' state, switch 3 is maintained in an 'on' state, and switch 4 is maintained in an 'off' state. Even though switch 1 is in an 'off' state, current flows in a counter-clockwise direction in the circuit through the diode portion of switch 1.

Figure 5:
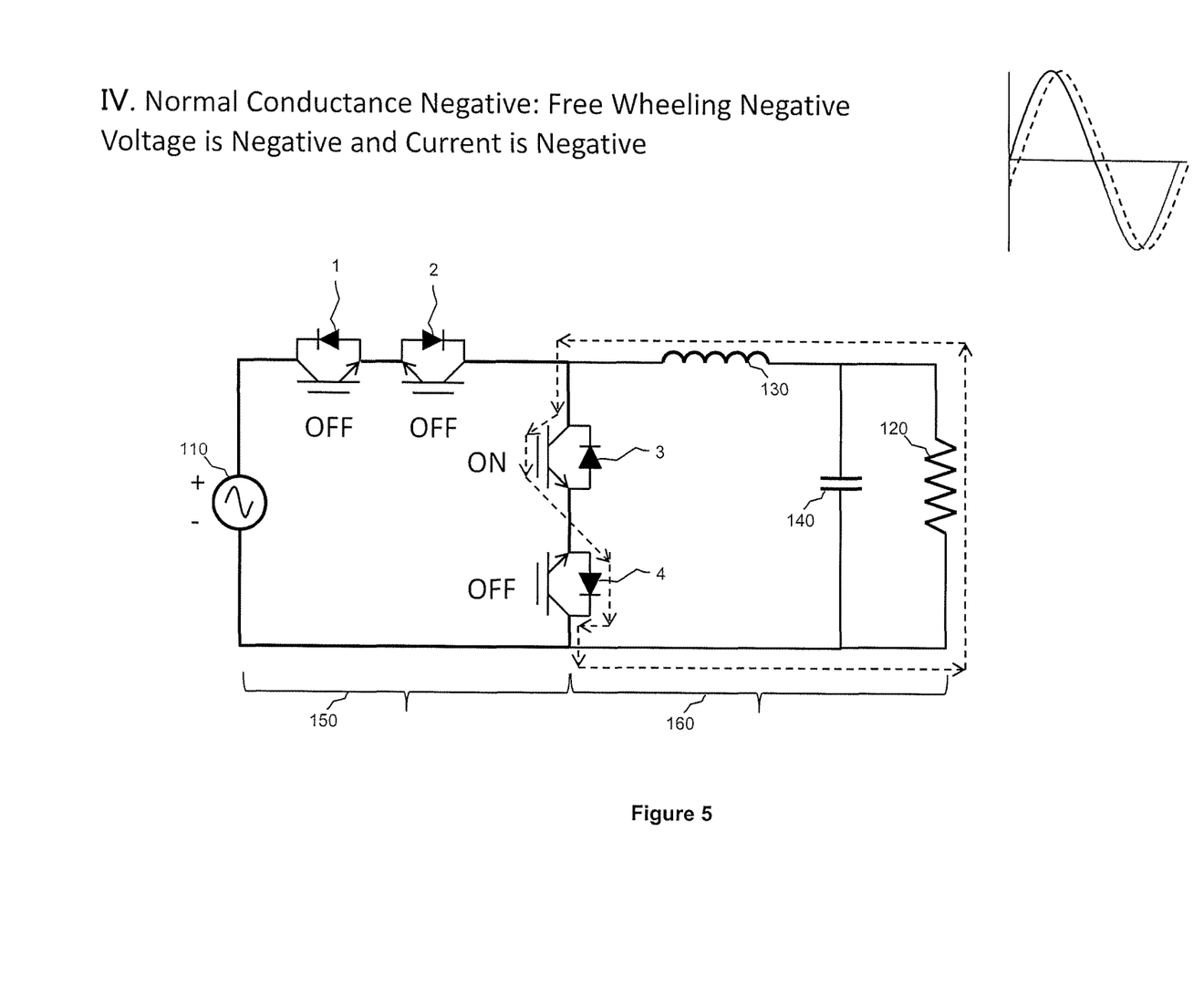
FIG. 5 is a schematic diagram of a freewheeling circuit with normal conductance and with negative voltage and negative current.

In FIG. 5, normal conductance is occurring, wherein both voltage and current are negative. The conductance may be considered freewheeling, in that current is flowing from the inductor 130 through only the load portion 160 of the circuit. To achieve such a state, switch 1 and switch 2 are both maintained in an 'off' state, thus preventing current flow through the line portion 150 of the circuit. Switch 3 is maintained in an on state, and switch 4 is maintained in an 'off' state. Even though switch 4 is in an 'off' state, current flows in a counter-clockwise direction in the load portion 160 of the circuit through the diode portion of switch 4.

In FIGS. 2 through 5, transitions from active to dead time to freewheeling are possible. The bi-directional switches used in the disclosed embodiments allow transitions directly from active to freewheeling by always keeping an IGBT closed and ready for the diode to freewheel. In transitions between active and freewheeling, only one switch is changed.

As mentioned above, cross conductance periods may occur in which the voltage and the current have opposite polarities. In such periods, the switch settings used in the AC choppers of FIGS. 2 through 5 may not be appropriate. In an embodiment, feedback regarding the voltage and/or current in an AC chopper is provided to a processing unit. The processing unit uses the feedback to determine when a cross conductance period is occurring. The processing unit then provides signaling to the AC chopper that causes the switches in the AC chopper to be set in an appropriate state that allows a constant current to be maintained during the cross conductance period.

FIGS. 6, 7, and 8 illustrate embodiments of AC choppers in cross conductance periods. In the upper circuit of the figures, voltage is negative and current is positive, and in the lower circuit of the figures, voltage is positive and current is negative.

FIG. 6 illustrates active cases in which current is provided by the power source 100 and flows through both the line portion 150 and the load portion 160 of the circuit. In such cases, switch 1 and switch 2 are set to 'on', and switch 3 and switch 4 are set to 'off'. Current will not flow without both switch 1 and switch 2 being 'on'. The IGBT portions of switches 1 and 2 equalize the charge, while the diode portions of the switches allow current to flow through both the line portion 150 and the load portion 160 of the circuit.

FIG. 7 illustrates dead time cases, where current is not flowing in the circuit. The dead time cases may occur between the active cases of FIG. 6 and the freewheeling cases of FIG. 8. In the dead time cases, switches 1, 2, 3, and 4 are all set to 'off'. In these cases, charge will build up on the inductor 130 during the dead time because the diodes will not turn on and freewheel automatically. In an embodiment, such a situation may be dealt with by minimizing the dead time to the off time of the IGBT.

In an embodiment, the amount of time that is spent in the dead time of FIG. 7 is fixed by the characteristics of the switches in the AC chopper. That is, the processing unit that controls the turning on and turning off of the switches may be aware of the length of time needed to turn the switches on and off and may control the dead time accordingly. The length of the dead time may be independent of the load on the AC chopper circuit.

FIG. 8 illustrates freewheeling cases in which current is provided by the inductor 130 and flows only through both the load portion 160 of the circuit. In such cases, switch 1 and switch 2 are set to 'off', and switch 3 and switch 4 are set to 'on.' Current will not flow without both switch 3 and switch 4 being 'on'. The IGBT portions of switches 3 and 4 equalize the charge, while the diode portions of the switches allow current to flow through the load portion 160 of the circuit.

Alternatively, rather than the current being provided by the series inductor 130, current may be provided in freewheeling cases by the parallel capacitor 140. The inductor 130 or the capacitor 140 may be referred to generically herein as a temporary energy storage device.

In the embodiments of FIGS. 6, 7, and 8, in cross conductance active, dead time, and cross conductance freewheeling, all four switches change states. The cross conductance active and cross conductance freewheeling states allow for low THD even with complex loads. In addition, moving from active directly to freewheeling reduces EMC noise.

Figure 9:
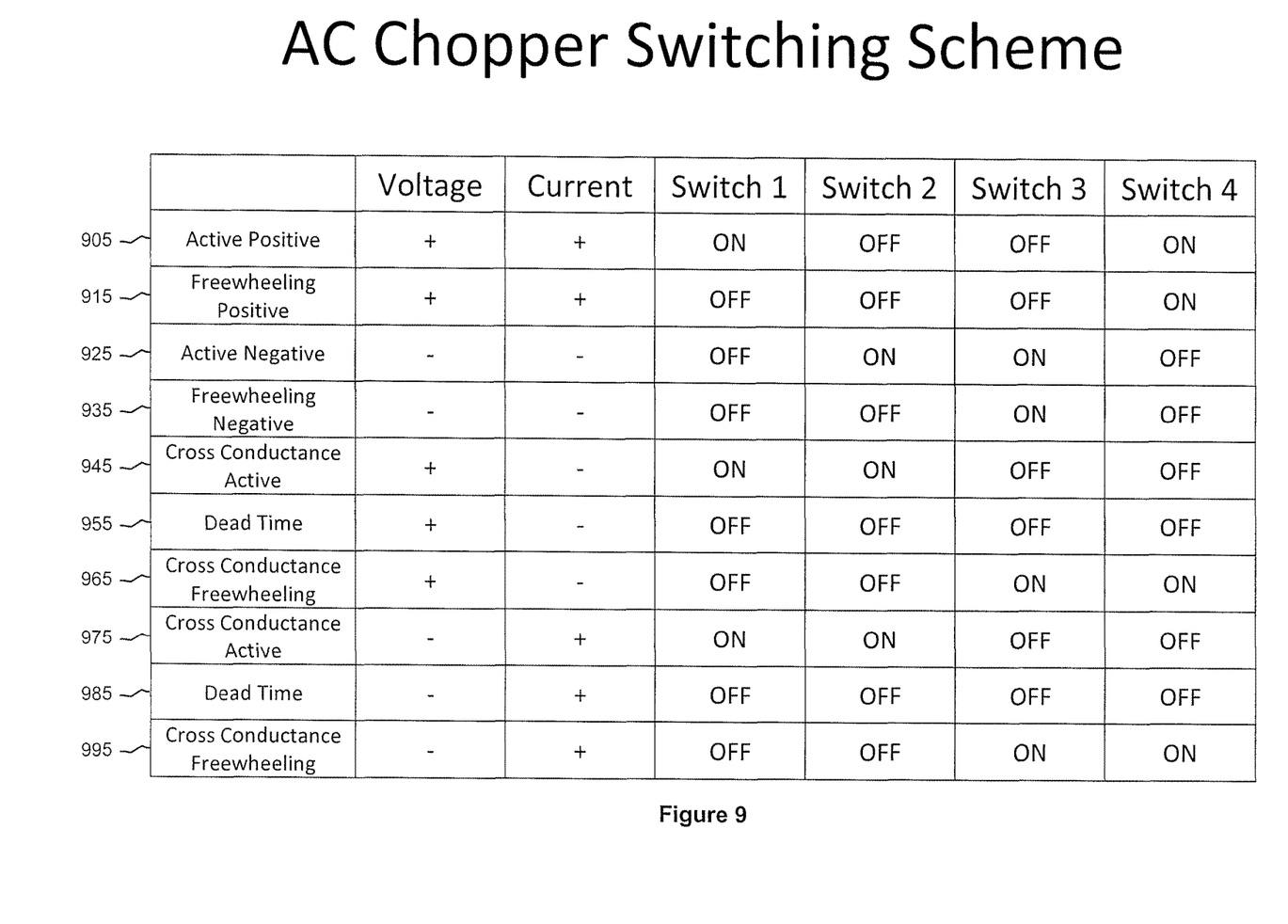
FIG. 9 is a table of switch states in an AC chopper switching scheme, according to an embodiment of the disclosure.

FIG. 9 is a table of switch states in an embodiment of an AC chopper switching scheme. The table summarizes the on/off status of the switches in the AC chopper circuits of FIGS. 2 through 8. Row 905 corresponds to the active positive circuit of FIG. 2, where switch 1 and switch 4 are on and the other switches are off. Row 915 corresponds to the freewheeling positive circuit of FIG. 3, where switch 4 is on and the other switches are off. Row 925 corresponds to the active negative circuit of FIG. 4, where switch 2 and switch 3 are on and the other switches are off. Row 935 corresponds to the freewheeling negative circuit of FIG. 5, where switch 3 is on and the other switches are off.

The remaining rows in the table represent embodiments of states that may be imposed on the switches during cross conductance periods. Row 945 and row 975 correspond to the cross conductance active circuits of FIG. 6, where switch 1 and switch 2 are on and the other switches are off. Row 955 and row 985 correspond to the cross conductance dead time circuits of FIG. 7, where all of the switches are off. Row 965 and row 995 correspond to the cross conductance freewheeling circuits of FIG. 8, where switch 3 and switch 4 are on and the other switches are off.

Figure 10:
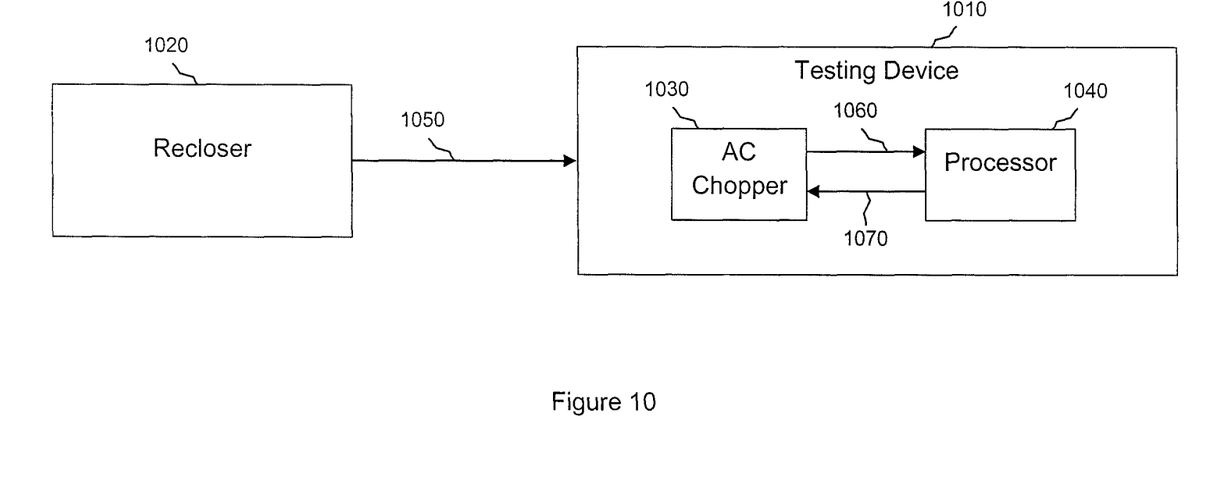
FIG. 10 is a schematic diagram of a system for maintaining a constant current in an electrical component undergoing testing, according to an embodiment of the disclosure.

FIG. 10 illustrates an embodiment of a testing device 1010 that may be used to test a recloser 1020 or some other type of component in an electric power transmission and distribution system. It may be desired that a constant current be maintained in the recloser 1020 during the test procedure. The testing device 1010 includes an AC chopper 1030 and a processor 1040, such as a digital signal processor (DSP). The AC chopper 1030 may include a plurality of bi-directional switches as discussed above. While the AC chopper 1030 is depicted as a component within the testing device 1010, in other embodiments the AC chopper 1030 may be physically or logically located outside the testing device 1010.

The processor 1040 may receive feedback via paths 1050 and 1060 regarding the status of the voltage and/or current in the recloser 1020. In an embodiment, the feedback is current mode feedback. Using this feedback information, the processor 1040 may determine an appropriate on/off status for the bi-directional switches in the AC chopper 1030 that will impose a duty cycle on the switches that will in turn cause a desired, substantially constant or substantially set current to be maintained through the recloser 1020, even during cross conductance periods. Via path 1070, the processor 1040 may then send appropriate signaling to the AC chopper 1030 to cause the switches to be set in the appropriate states that will achieve the desired duty cycle.

As used herein, the terms "substantially constant current" or "substantially set current" may refer to a current that remains within an acceptable range of a desired current for a desired length of time. During a testing procedure, a current maybe changed from one substantially set value to another substantially set value, but either of the values may be considered a substantially set current during the time the current remains at that value.

In an embodiment, the digital measurement and automatic control techniques disclosed above may provide zero DC offset current waveforms. Circuit breakers may trip prematurely if there is a large DC spike at the beginning of a waveform. A large DC spike may occur when a complex impedance load is present and the waveform starts, or "fires", from 0 degrees or any other non-ideal angle for that load on that test set. The ideal waveform firing angle is a function of the impedance of not only the load but the system including the test set. With digital current measurement, the firing angle can be automatically calculated by the phase shift between the line voltage and the output current at a lower pre-test current and then adjusted for the full test. In this way, a desired current pulse is given each time requested. It may also be possible to determine if there was a DC offset on the test.

In an embodiment, a testing device is provided. The testing device comprises a processor and a switching AC to AC power converter that has no DC link. The processor is configured to set a plurality of bi-directional switches in the power converter in a configuration of on/off states that cause a substantially set electric current to flow through a component being tested by the testing device.

In another embodiment, a switching AC to AC power converter that has no DC link is provided. The power converter comprises a plurality of bi-directional switches configured to be set in a configuration of on/off states that provide in an electric circuit a duty cycle that causes a substantially set electric current to flow in the electric circuit.

In another embodiment, a method for maintaining a substantially set current in an electric circuit is provided. The method comprises receiving, by a processing component, information regarding at least one of a voltage and a current in the electric circuit; determining, by the processing component, based on the information, a configuration of on/off states for a plurality of bi-directional switches in a switching AC to AC power converter that has no DC link and that is coupled to the electric circuit, wherein the configuration causes the substantially set electric current to flow through the electric circuit; and providing, by the processing component, the configuration to the power converter such that the power converter sets the bi-directional switches in the configuration.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A testing device comprising:
    a switching alternating current (AC) to AC power converter that has no direct current (DC) link; and
    a processor configured to set a plurality of bi-directional switches in the power converter in a configuration of on/off states that cause a substantially set electric current to flow through a component being tested by the testing device,
    wherein the power converter comprises:
        a first pair of bi-directional switches in series with an AC power source and with the component being tested; and
        a second pair of bi-directional switches in series with one another and in parallel with the AC power source or with the component being tested,
    wherein each of the first pair of bi-directional switches and the second pair of bi-directional switches comprises a transistor and a diode,
    wherein a first terminal of the transistor is electrically connected to an anode of the diode, and
    wherein a second terminal of the transistor is electrically connected to a cathode of the diode.

2. The testing device of claim 1, wherein the processor determines the configuration of the on/off states based on information regarding at least one of a voltage and a current in the component being tested, the information having been fed back to the processor from the component being tested.

3. The testing device of claim 1, wherein, when the power converter is in a cross conductance active state in which voltage and current in the power converter have opposite polarities and power is provided to or from the component being tested to or from the AC power source, each of the first pair of bi-directional switches is set to an on state and each of the second pair of bi-directional switches is set to an off state.

4. The testing device of claim 3, wherein, when the power converter is in a cross conductance freewheeling state in which voltage and current in the power converter have opposite polarities and power is not provided to or from the component being tested to or from the AC power source but instead is provided by a temporary energy storage device in series or parallel with the component being tested, each of the first pair of bi-directional switches is set to an off state and each of the second pair of bi-directional switches is set to an on state.

5. The testing device of claim 4, wherein, when a transition occurs between the cross conductance active state and the cross conductance freewheeling state or when no power is provided to or from the component being tested to or from the AC power source or to or from the temporary energy storage device, both pairs of bi-directional switches are set to an off state.

6. The testing device of claim 1, wherein the component being tested is an impedance of constant or variable nature.

7. A switching alternating current (AC) to AC power converter that has no direct current (DC) link, the power converter comprising:
a plurality of bi-directional switches configured to be set in a configuration of on/off states that provide in an electric circuit a duty cycle that causes a substantially set electric current to flow in the electric circuit,
wherein the power converter comprises:
a first pair of bi-directional switches in series with an AC power source and with an impedance load; and
a second pair of bi-directional switches in series with one another and in parallel with an AC power source or with the impedance load,
wherein each of the first pair of bi-directional switches and the second pair of bi-directional switches comprises a transistor and a diode,
wherein a first terminal of the transistor is electrically connected to an anode of the diode, and
wherein a second terminal of the transistor is electrically connected to a cathode of the diode.

8. The power converter of claim 7, wherein the configuration of the on/off states is provided to the power converter by a processor that determines the configuration based on information provided to the processor regarding at least one of a voltage and a current in the power converter.

9. The power converter of claim 7, wherein, when the power converter is in a cross conductance active state in which voltage and current in the power converter have opposite polarities and power is provided to or from the impedance load to or from the AC power source, each of the first pair of bi-directional switches is set to an on state and each of the second pair of bi-directional switches is set to an off state.

10. The power converter of claim 9, wherein, when the power converter is in a cross conductance freewheeling state in which voltage and current in the power converter have opposite polarities and power is not provided to or from the impedance load to or from the AC power source but instead is provided by a temporary energy storage device in series or parallel with the impedance load, each of the first pair of bi-directional switches is set to an off state and each of the second pair of bi-directional switches is set to an on state.

11. The power converter of claim 10, wherein, when a transition occurs between the cross conductance active state and the cross conductance freewheeling state or when no power is provided to or from the impedance load to or from the AC power source or to or from the temporary energy storage device, both pairs of bi-directional switches are set to an off state.

12. A method for maintaining a substantially set current in an electric circuit, the method comprising:
receiving, by a processing component, information regarding at least one of a voltage and a current in the electric circuit;
determining, by the processing component, based on the information, a configuration of on/off states for a plurality of bi-directional switches in a switching alternating current (AC) to AC power converter that has no direct current (DC) link and that is coupled to the electric circuit, wherein the configuration causes the substantially set electric current to flow through the electric circuit; and
providing, by the processing component, the configuration to the power converter such that the power converter sets the bi-directional switches in the configuration,
wherein the power converter comprises:
a first pair of bi-directional switches in series with an AC power source and with an impedance load; and
a second pair of bi-directional switches in series with one another and in parallel with the AC power source or with the impedance load,
wherein each of the first pair of bi-directional switches and the second pair of bi-directional switches comprises a transistor and a diode,
wherein a first terminal of the transistor is electrically connected to an anode of the diode, and
wherein a second terminal of the transistor is electrically connected to a cathode of the diode.

13. The method of claim 12, wherein, when the power converter is in a cross conductance active state in which voltage and current in the power converter have opposite polarities and power is provided to or from the impedance load to or from the AC power source, each of the first pair of bi-directional switches is set to an on state and each of the second pair of bi-directional switches is set to an off state.

14. The method of claim 13, wherein, when the power converter is in a cross conductance freewheeling state in which voltage and current in the power converter have opposite polarities and power is not provided to or from the impedance load to or from the AC power source but instead is provided by a temporary energy storage device in series or parallel with the impedance load, each of the first pair of bi-directional switches is set to an off state and each of the second pair of bi-directional switches is set to an on state.

15. The method of claim 14, wherein, when a transition occurs between the cross conductance active state and the cross conductance freewheeling state or when no power is provided to or from the impedance load to or from the AC power source or to or from the temporary energy storage device, both pairs of bi-directional switches are set to an off state.

16. The method of claim 12, wherein the impedance load is a component undergoing testing by a testing device that comprises the power converter and the processing component.

17. The method of claim 16, wherein the component undergoing testing is a device with an impedance of constant or variable nature.

* * * * *